(12) United States Patent
Arai et al.

(10) Patent No.: US 6,876,264 B2
(45) Date of Patent: Apr. 5, 2005

(54) SURFACE-MOUNT CRYSTAL OSCILLATOR

(75) Inventors: Masaaki Arai, Saitama (JP); Masakazu Nishiwaki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 74 days.

(21) Appl. No.: 10/636,151

(22) Filed: Aug. 7, 2003

(65) Prior Publication Data

US 2004/0036546 A1 Feb. 26, 2004

(30) Foreign Application Priority Data

Aug. 9, 2002 (JP) ........................................ 2002-232254

(51) Int. Cl.⁷ ................................................. H03B 5/36
(52) U.S. Cl. ..................... 331/68; 331/108 D; 331/158; 310/318
(58) Field of Search .................... 331/68–69, 108 C, 331/108 D, 116 R, 116 FE, 158; 310/318

(56) References Cited

FOREIGN PATENT DOCUMENTS

| JP | 6-232631 | 8/1994 | |
|---|---|---|---|
| JP | 2001244744 A | * 9/2001 | ............ H03B/5/32 |
| JP | 2001-308644 | 11/2001 | |

* cited by examiner

Primary Examiner—David Mis
(74) Attorney, Agent, or Firm—Katten Muchin Zavis Rosenman

(57) ABSTRACT

A surface-mount quartz crystal oscillator has a casing having a recess defined therein, a quartz crystal blank fixedly mounted on the bottom of the recess, and an IC (Integrated Circuit) chip having an integrated oscillating circuit connected to the crystal blank. The casing has a frame wall which defines the recess. The IC chip has an outer peripheral edge joined to an upper surface of the frame wall. The crystal blank is hermetically sealed in a space surrounded by the casing and the IC chip. IC connecting terminals are disposed on the upper surface of the frame wall for connection to IC terminals on the IC chip.

8 Claims, 3 Drawing Sheets

SURFACE-MOUNT CRYSTAL OSCILLATOR

BACKGROUND OF THE INVENTION

1. Field of the Invention

The present invention relates to a surface-mount quartz crystal oscillator, and more particularly to a surface-mount crystal oscillator which is of a small height and a low cost.

2. Description of the Related Art

Since surface-mount crystal oscillators are small in size and weight, they are widely used as a frequency or time reference source in portable electronic devices. In recent years, efforts are being made to achieve more size reductions in surface-mount crystal oscillators, and there are demands for reductions to be accomplished in the cost of surface-mount crystal oscillators through increased productivity. In the application to cellular phone devices or the like, the surface-mount crystal oscillators are required to be small in height as well as in planar outer dimensions.

FIG. 1 shows in cross section a conventional surface-mount crystal oscillator.

As shown in FIG. 1, the conventional surface-mount crystal oscillator generally comprises IC (Integrated Circuit) chip 2 and quartz crystal blank 3 which are housed in casing 1. Casing 1 is basically made of three-layer laminated ceramics and has a recess. Steps are formed in the inner surface of a frame wall which defines the recess. A pair of connecting terminals 7 is disposed on the upper surface of one of the steps for electrically connecting to crystal blank 3. IC connecting terminals 6 are disposed on the bottom of the recess in casing 1 for connection to IC chip 2. Connecting terminals 7 and IC connecting terminals 6 are electrically connected to each other by conductive paths (not shown) disposed in casing 1.

IC chip 2 comprises an integrated oscillating circuit connected to crystal blank 3 which functions as a quartz crystal unit. A plurality of IC terminals 4 for connecting IC chip 2 to crystal blank 3 and an external circuit are mounted on at least one of principal surfaces of IC chip 2. IC terminals 4 and IC connecting terminals 6 are electrically and mechanically connected to each other by ultrasonic thermo-compression bonding with bumps 5, for example, interposed therebetween, thus fixing one of the principal surfaces of IC chip 2 to the bottom of the recess in casing 1.

Crystal blank 3 comprises a substantially rectangular AT-cut quartz crystal blank, for example. Excitation electrodes are formed respectively on both principal surfaces of crystal blank 3, and extension electrodes extend from the respective excitation electrodes to opposite sides of one end of crystal blank 3. The sides of the end of crystal blank 3 to which the extension electrodes extend are fixed to the step of casing 1 on which connecting electrodes 7 are disposed, thereby holding crystal blank 3 horizontally in casing 1. Crystal blank 3 is fixed to the step by electrically conductive adhesive 10. Therefore, IC chip 2 is electrically connected to crystal blank 3 by IC terminals 4, IC connecting terminals 6, and connecting terminals 7.

The conventional surface-mount crystal oscillator is assembled as follows: IC chip 2 is fixedly mounted in casing 1, and crystal blank 3 is also fixedly mounted in casing 1. Thereafter, cover 8 is placed on the upper surface of the frame wall that surround the recess in casing 1, thereby hermetically sealing IC chip 2 and crystal blank 3 in casing 1. Mounting terminals 9 that are electrically connected to IC connecting terminals 6 are disposed on the outer surface of the bottom of casing 1. Mounting terminals 9 are used to install the surface-mount crystal oscillator on a wiring board and connect the surface-mount crystal oscillator to an external circuit.

The surface-mount crystal oscillator described just above is assembled by fixing IC chip 2 to the bottom of the recess in casing 1 and thereafter holding the opposite sides of one end of crystal blank 3 on the step in the recess in casing 1. After crystal blank 3 is held in position, it is measured for electric characteristics. If the measured electric characteristics do not meet predetermined criteria, then the assembly is rejected as a defective product. Since the rejected assembly includes expensive IC chip 2, the productivity is lowered and the cost is increased.

It is difficult to reduce the height of the surface-mount crystal oscillator because casing 1 is of a laminated ceramics structure with two stages and cover 8 is placed thereon.

A quartz crystal unit changes its vibrating characteristics and electric characteristics when it is fixed in place because conditions under which the crystal blank vibrates are different before and after the crystal blank is fixed in place. Therefore, even if crystal blank 3 has good vibrating characteristics or electric characteristics, e.g., crystal impedance or frequency vs. temperature characteristics, by itself, the characteristics may possibly become poor after the crystal blank is fixed to the step, and the whole assembly may be rejected as failing to meet the criteria.

Japanese laid-open patent publications Nos. 2001-308644 (JP, P2001-308644A) and 6-232631 (JP, 6-232631, A) disclose surface-mount crystal oscillators which are assembled as follows: An assembling process in which a crystal blank is fixed to the bottom of a recess defined in a casing, and then measured for vibrating characteristics. If the measured vibrating characteristics fail to satisfy predetermined criteria, the assembly is rejected as a defective product with no IC chip included. An IC chip is installed only in the casing only when the installed crystal blank is judged as having accepted vibrating characteristics. However, there is a limitation on efforts to reduce the height of the disclosed surface-mount crystal oscillators because a separate cover needs to be mounted on the casing.

SUMMARY OF THE INVENTION

It is therefore an object of the present invention to provide a surface-mount crystal oscillator which can be manufactured with increased productivity and has a reduced height.

The above object can be achieved by a surface-mount crystal oscillator comprising a casing having a recess defined therein, a crystal blank fixedly mounted on the bottom of the recess, and an IC (Integrated Circuit) chip having an integrated oscillating circuit connected to the crystal blank, the casing having a frame wall which defines the recess, the IC chip having an outer peripheral edge joined to an upper surface of the frame wall, the crystal blank being hermetically sealed in a space surrounded by the casing and the IC chip.

With the above arrangement, vibrating characteristics of the crystal blank which operates as a quartz crystal unit can be confirmed before the IC chip is joined to the casing. Therefore, the IC chip which is expensive to manufacture will not be wasted even if the crystal blank is found defective in view of the vibrating characteristics thereof which have been measured. Accordingly, the surface-mount crystal oscillator can be manufactured with increased productivity. The IC chip also doubles as a cover for covering the recess. Consequently, the surface-mount crystal oscillator may be of a height smaller than if an independent cover were employed thereby.

DETAILED DESCRIPTION OF THE INVENTION

Figure 1:
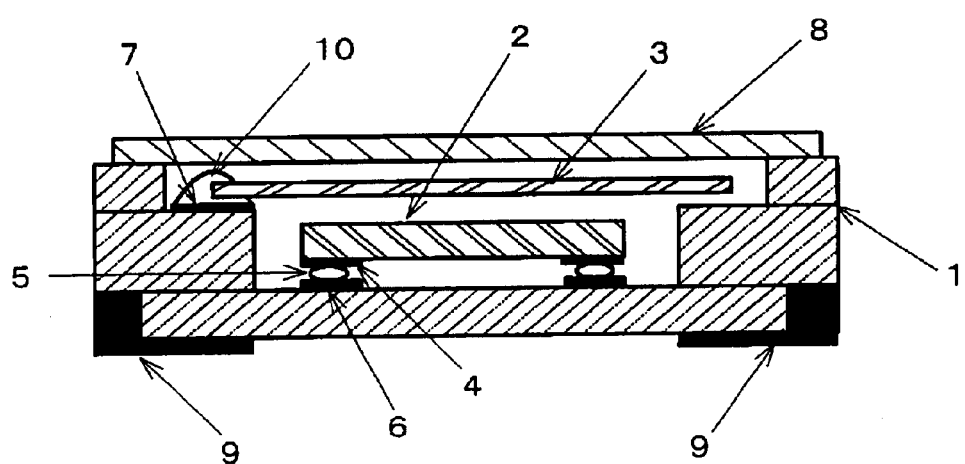
FIG. 1 is a cross-sectional view of a conventional surface-mount crystal oscillator.
Figure 2:
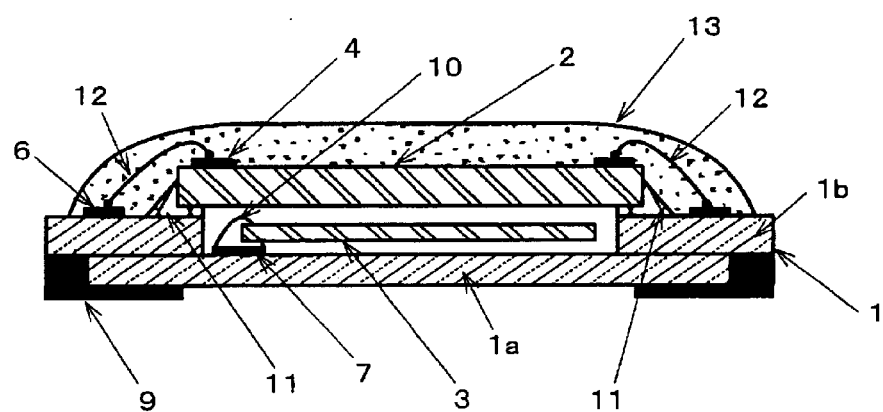
FIG. 2 is a cross-sectional view of a surface-mount crystal oscillator according to a first embodiment of the present invention.
Figure 3:
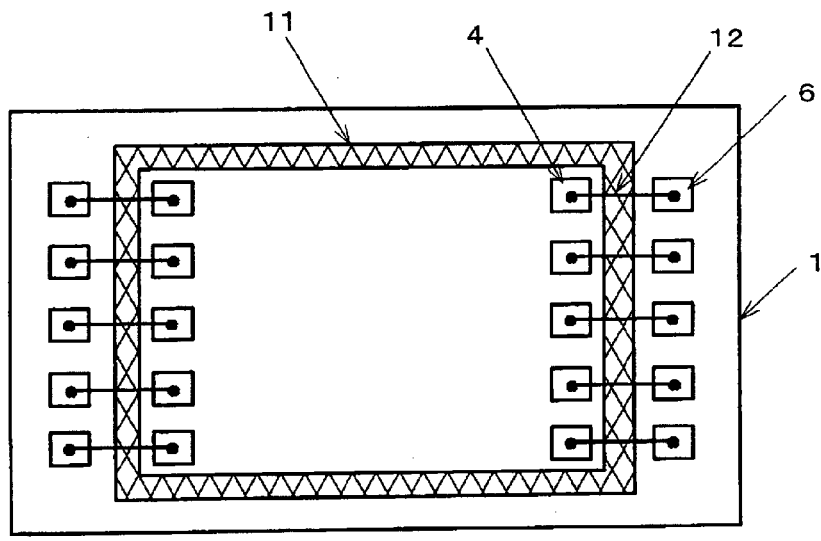
FIG. 3 is a plan view of the surface-mount crystal oscillator shown in FIG. 2, with a resin layer omitted from illustration.

In FIGS. 2 and 3 which show a surface-mount quartz crystal oscillator according to a first embodiment of the present invention, those parts which are identical to those shown in FIG. 1 are denoted by identical reference characters.

As shown in FIGS. 2 and 3, the surface-mount crystal oscillator according to the first embodiment generally comprises casing 1, IC chip 2, and quartz crystal blank 3. Casing 1 is made of two-layer laminated ceramic and is in the shape of a substantially rectangular parallelepiped. Casing 1 has a recess defined in one of the principal surfaces thereof. Specifically, casing 1 is of a two-layer structure including substantially rectangular bottom wall 1a and frame wall 1b in the form of a frame extending along the rectangular peripheral edge of bottom wall 1a and joined thereto. The periphery of the recess is defined by frame wall 1b. A pair of connecting terminals 7 is disposed on the upper surface of bottom wall 1a, that is, the bottom of the recess, for electrically connecting to crystal blank 3. IC connecting terminals 6 are disposed on the upper surface of frame wall 1b for connection to IC chip 2. IC connecting terminals 6 are electrically connected to connecting terminals 7 via through holes defined in frame wall 1b. IC connecting terminals 6 are also electrically connected to mounting terminals 9 disposed on the outer surface of casing 1 via through holes defined in frame wall 1b and bottom wall 1a.

Crystal blank 3 is identical to the crystal blank used in the conventional crystal oscillator shown in FIG. 1. The sides of the end of crystal blank 3 to which the extension electrodes extend are fixed to the connecting terminals 7 on the bottom of casing 1 by electrically conductive adhesive 10, thereby holding crystal blank 3 in casing 1 parallel to the bottom of casing 1.

IC chip 2 has an integrated oscillating circuit and the like, and supports IC terminals 4 disposed on opposite ends of one principal surface thereof. IC chip 2 has an outer profile as seen in plan which is large enough to cover the recess in casing 1. The other principal surface of IC chip 2 is bonded at its fully outer peripheral edge to the upper surface of frame wall 1b of casing 1 by adhesive 11. Therefore, IC chip 2 also functions as a cover disposed over the recess in casing 1, leaving crystal blank 3 hermetically sealed in the recess. IC terminals 4 are connected to IC connecting terminals 6 on the upper surface of frame wall 1b with gold wires 12 by wire bonding. Resin layer 13 is placed over the one principal surface of IC chip 2 including gold wires 12 and IC connecting terminals 6. Resin layer 13 is formed by applying a resin liquid and hardening the resin liquid after IC chip 2 is fixed to casing 1 and connected by wire bonding. Resin layer 13 may be disposed on only an outer peripheral region of IC chip 2 including gold wires 12, IC terminals 4, and IC connecting terminals 6, leaving the central region of the one principal surface of IC chip 2 exposed.

With the above structure of the surface-mount crystal oscillator, since crystal blank 3 is fixed to the bottom of the recess in casing 1 before IC chip 2 is installed, fixed crystal blank 3 can easily be measured for vibrating characteristics, and may be rejected if found defective without wasting expensive IC chip 2. Therefore, the surface-mount crystal oscillator can be manufactured with increased productivity. As IC chip 2 doubles as a cover with its outer peripheral edge joined to the upper surface of frame wall 1b, any independent cover which has been required in the conventional surface-mount crystal oscillator is dispensed with. As a result, the height of the surface-mount crystal oscillator is reduced. Furthermore, inasmuch as resin layer 13 is disposed over IC chip 2 including its outer peripheral region (i.e., joined edge), the terminals connected by wire bonding are protected, and the recess in casing 1 is highly hermetically sealed.

Figure 4:
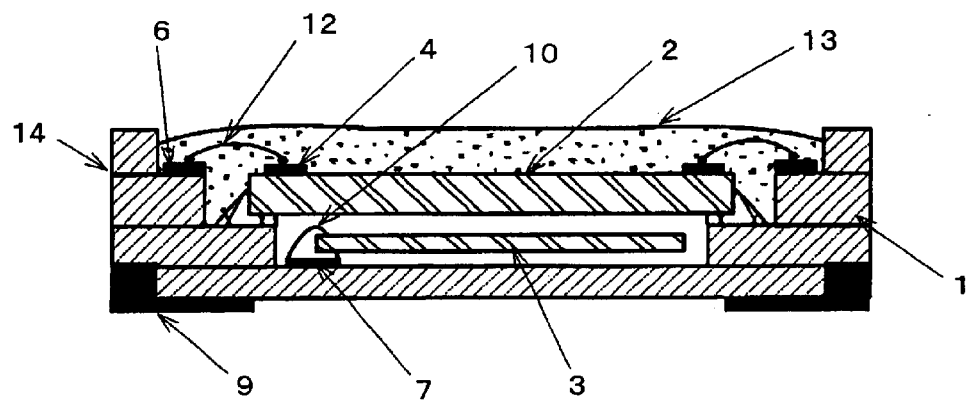
FIG. 4 is a cross-sectional view of a modification of the surface-mount crystal oscillator shown in FIG. 2.

FIG. 4 shows in cross section a modification of the surface-mount crystal oscillator shown in FIG. 2. The modified surface-mount crystal oscillator differs from the surface-mount crystal oscillator shown in FIGS. 2 and 3 in that second frame wall 14 is placed on the upper surface of frame wall 1b of casing 1. Second frame wall 14 is made of ceramic and is disposed along the outer peripheral edge of IC chip 2. Second frame wall 14 defines has a step portion which is formed by the upper surface of frame wall 1b. IC connecting terminals 6 are disposed on the step portion. A resin liquid is poured into the space surrounded by second frame wall 14 to form resin layer 13 in the region surrounded by frame wall 1b and second frame wall 14. The modified surface-mount crystal oscillator also has a reduced height.

IC chip 2 may be fixed to frame wall 1b without the use of an adhesive. For example, metal films may be disposed respectively on the outer peripheral edge of the other principal surface of IC chip 2 and the inner peripheral edge of the upper surface of frame wall 1b, and the metal films may be joined to each other by an eutectic alloy layer such as AuSn (gold-tin) alloy, AuGe (gold-germanium) alloy, or the like interposed therebetween. In this example, since no adhesive is used, no organic gas is generated, making the vibrating characteristics of crystal blank 3 more stable.

Figure 5:
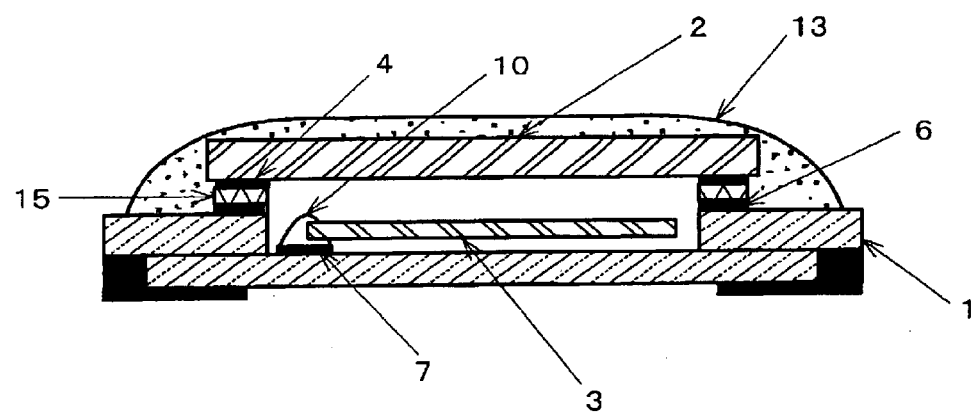
FIG. 5 is a cross-sectional view of a surface-mount crystal oscillator according to a second embodiment of the present invention.

FIG. 5 shows in cross section a surface-mount crystal oscillator according to a second embodiment of the present invention. In the first embodiment, the other principal surface of IC chip 2 is joined to frame wall 1b of casing 1. According to the second embodiment, the principal surface of IC chip 2 on which IC terminals 4 are disposed, which is referred to as the one principal surface of IC chip 2, is joined to the upper surface of frame wall 1b. IC terminals 4 on IC chip 2 and IC connecting terminals 6 on the upper surface of frame wall 1b are electrically connected to each other by anisotropic electrically conductive adhesive 15, and the outer peripheral edge of IC chip 2 and the upper surface of frame wall 1b are joined to each other. Resin layer 13 is disposed over IC chip 2 including its outer peripheral edge of IC chip 2.

Alternatively, the upper surface, as shown, of IC chip 2, i.e., the other principal surface of IC chip 2, may be free of any resin layer, and resin layer 13 may be disposed on only the side edge of IC chip 2 and the upper surface of frame wall 1b. For forming resin layer 13 in such a pattern, a frame member which is thinner than IC chip 2 may be formed on the upper surface of frame wall 1b as by printing, and a resin liquid may be poured into the frame member.

Anisotropic electrically conductive adhesive 15 is generally made of a resin mixed with electrically conductive balls of constant diameter. When such an anisotropic electrically conductive adhesive is applied to mating surfaces of members that are to be bonded and the mating surfaces of the members are pressed against each other, the electrically conductive balls are forced into rows between the members, electrically connecting the members to each other. However, the anisotropic electrically conductive adhesive is electrically insulated by the resin in a direction perpendicular to the direction in which the members are pressed against each other, i.e., along the layer of the anisotropic electrically conductive adhesive between the members.

With the structure shown in FIG. 5, since crystal blank 3 is fixed to the bottom of the recess in casing 1 before IC chip 2 is installed, fixed crystal blank 3 can be measured for vibrating characteristics in advance of the installation of IC chip 2, and the surface-mount crystal oscillator can be manufactured with increased productivity. As IC chip 2 doubles as a cover for covering the recess in casing 1, the height of the surface-mount crystal oscillator is reduced. The recess is highly hermetically sealed by resin layer 13 which is disposed on at least the outer peripheral edge (i.e., joined edge) of IC chip 2.

What is claimed is:

1. A surface-mount crystal oscillator comprising:

a casing having a recess defined therein;

a crystal blank fixedly mounted on a bottom of said recess; and an IC chip having an integrated oscillating circuit connected to said crystal blank;

said casing having a frame wall which defines said recess, said IC chip having an outer peripheral edge joined to an upper surface of said frame wall, said crystal blank being hermetically sealed in a space surrounded by said casing and said IC chip.

2. The surface-mount crystal oscillator according to claim 1, wherein said IC chip is joined to the upper surface of said frame wall by an adhesive.

3. The surface-mount crystal oscillator according to claim 1, further comprising:

IC terminals disposed on one principal surface of said IC chip; and

IC connecting terminals disposed on the upper surface of said frame wall;

said IC chip having the other principal surface which is joined to an inner peripheral edge of the upper surface of said frame wall, said IC terminals and said IC connecting terminals being electrically connected to each other with wires by wire bonding.

4. The surface-mount crystal oscillator according to claim 3, further comprising a resin layer disposed at least along the outer peripheral edge of said IC chip in covering relation to said IC connecting terminals and the wires by wire bonding.

5. The surface-mount crystal oscillator according to claim 4, further comprising a second frame wall mounted on the upper surface of said frame wall, said resin layer being formed by pouring a resin liquid into a space defined within said second frame wall.

6. The surface-mount crystal oscillator according to claim 2, further comprising:

IC terminals disposed on one principal surface of said IC chip; and

IC connecting terminals disposed on the upper surface of said frame wall;

said adhesive comprising an anisotropic electrically conductive adhesive, said IC terminals and said IC connecting terminals being electrically connected to each other by said anisotropic electrically conductive adhesive with said one principal surface facing the bottom of said recess.

7. The surface-mount crystal oscillator according to claim 6, further comprising a resin layer disposed on at least the upper surface of said frame wall along the outer peripheral edge of said IC chip.

8. The surface-mount crystal oscillator according to claim 1, wherein said casing is made of ceramic.

* * * * *